US012563807B2

(12) United States Patent
Tsai et al.

(10) Patent No.: US 12,563,807 B2
(45) Date of Patent: Feb. 24, 2026

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Wu-Wei Tsai, Taoyuan (TW); Yan-Yi Chen, Taipei (TW); Yu-Ming Hsiang, New Taipei (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 713 days.

(21) Appl. No.: 17/876,465

(22) Filed: Jul. 28, 2022

(65) Prior Publication Data

US 2024/0038854 A1     Feb. 1, 2024

(51) Int. Cl.
| | |
|---|---|
| *H10D 87/00* | (2025.01) |
| *H10D 30/67* | (2025.01) |
| *H10D 64/00* | (2025.01) |
| *H10D 64/01* | (2025.01) |
| *H10D 99/00* | (2025.01) |

(52) U.S. Cl.
CPC ....... *H10D 64/118* (2025.01); *H10D 30/6734* (2025.01); *H10D 64/01* (2025.01); *H10D 87/00* (2025.01); *H10D 99/00* (2025.01); *H10D 30/6739* (2025.01); *H10D 30/6755* (2025.01)

(58) Field of Classification Search
CPC .. H10D 64/118; H10D 30/6734; H10D 64/01; H10D 87/00; H10D 99/00; H10D 30/6739; H10D 30/6755; H10D 30/60; H10D 30/6757; H10D 30/751; H10D 62/80; H10D 86/423; H10D 86/60
See application file for complete search history.

(56) References Cited

U.S. PATENT DOCUMENTS

| | | | |
|---|---|---|---|
| 11,121,246 B2 * | 9/2021 | Or-Bach | ................ H10D 30/60 |
| 2010/0051933 A1 * | 3/2010 | Kim | .................... H10D 86/423 |
| | | | 257/E29.296 |

* cited by examiner

*Primary Examiner* — Elias Ullah
(74) *Attorney, Agent, or Firm* — JCIPRNET

(57) ABSTRACT

A semiconductor structure includes an active layer, a first gate insulator layer disposed over the active layer, a first gate layer disposed over the gate insulator layer, at least one charged layer disposed between the first gate insulator layer and the active layer, and a pair of contact structures disposed over the active layer. The at least one charged layer includes an oxide material.

20 Claims, 15 Drawing Sheets

220

210

10

SEMICONDUCTOR STRUCTURE AND MANUFACTURING METHOD THEREOF

BACKGROUND

Thin film transistors (TFT) made of oxide semiconductors are an attractive option for BEOL integration since TFTs may be processed at low temperatures and thus, will not damage previously fabricated devices. For example, the fabrication conditions and techniques may not damage previously fabricated FEOL devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
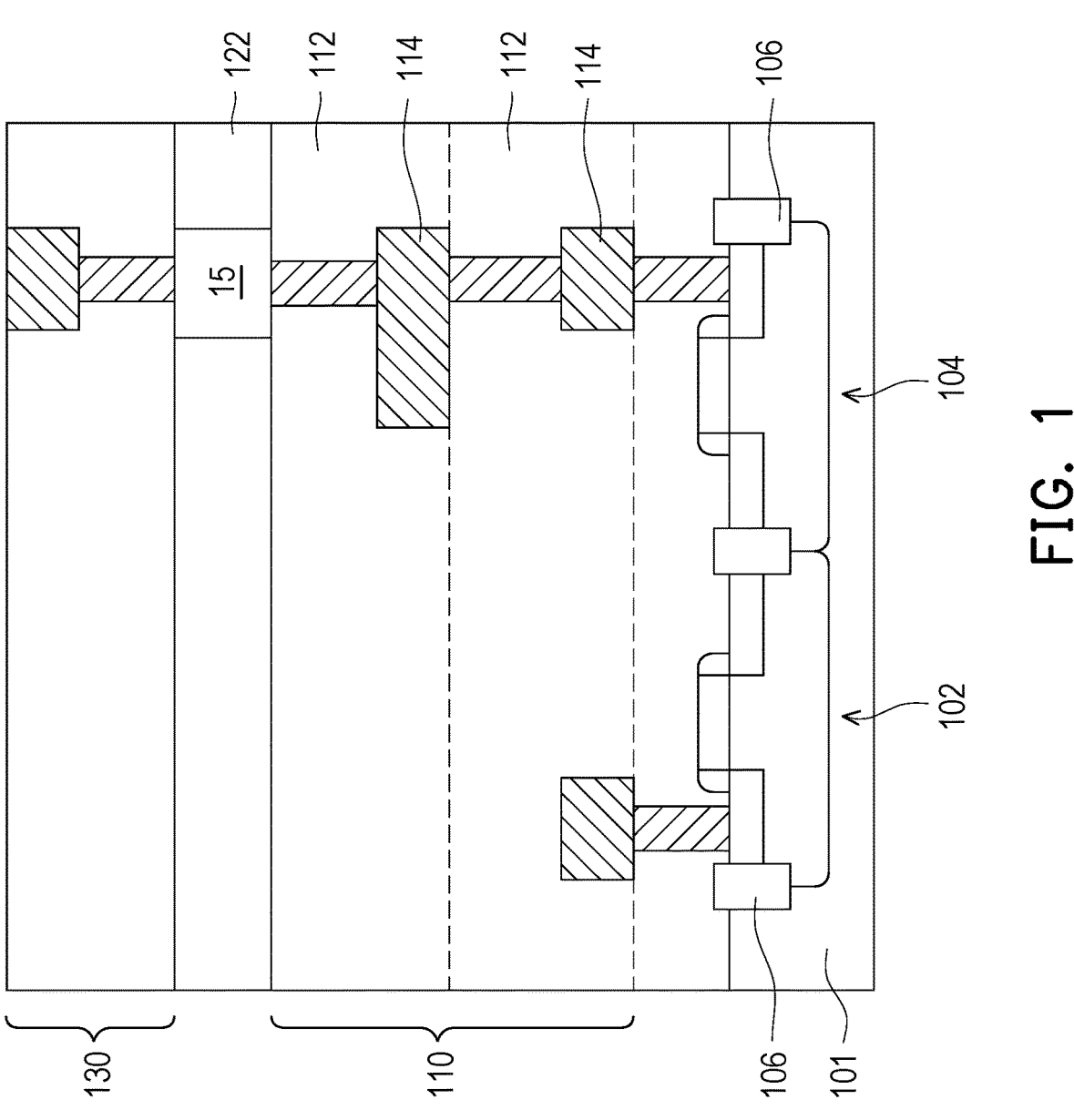
FIG. 1 is a schematic cross-sectional view showing a semiconductor structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description. Source/drain terminal(s) may refer to a source or a drain, individually or collectively dependent upon the context.

Embodiments of the present disclosure provide thin film transistors with an additional interfacial layer between an active layer (e.g., acted as channel region) and a gate insulator layer, and methods for forming such transistors. The interfacial layer may be used to provide positive carriers or negative carriers to the active layer, so as to modulate the threshold voltage of the thin film transistors. By introducing the interfacial layer, threshold voltages for thin film transistors can be controlled without performing any process to the active layer, which may cause unwanted shift of the electrical characteristics, such as on-current (Ion) and subthreshold swing (SS), thereof.

The interfacial layer can be formed between the gate insulator layer and the active layer using a suitable deposition process. Alternatively, the interfacial layer can be formed by performing surface treatment process at an upper portion of the gate insulator layer. Depending on the design requirements, more than one interfacial layers can be used.

The various aspects of the present disclosure will now be described in more detail with reference to the figures. FIG. 1 is a schematic cross-sectional view showing a semiconductor structure 10 in accordance with some embodiments of the disclosure.

Referring to FIG. 1, the semiconductor structure 10 includes a semiconductor substrate 101 and transistors such as a n-type metal-oxide-semiconductor (NMOS) 102 and a p-type metal-oxide-semiconductor (PMOS) 104 formed in the semiconductor substrate 101. The semiconductor substrate 101 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate may include an elemental semiconductor including silicon (Si) or germanium (Ge); a compound semiconductor; an alloy semiconductor; or a combination thereof. In some embodiments, the NMOS 102 and/or the PMOS 104 are formed following the complementary MOS (CMOS) processes.

As shown in FIG. 1, in some embodiments, more than one isolation structures 106 are formed in the semiconductor substrate 101. In certain embodiments, the isolation structures 106 are trench isolation structures. In other embodiments, the isolation structures 106 include local oxidation of silicon (LOCOS) structures. In some embodiments, the insulator material of the isolation structures 106 includes silicon oxide, silicon nitride, silicon oxynitride, a spin-on dielectric material, or a low-k dielectric material. The isolation structures 106 may be formed by chemical vapor deposition (CVD) process such as high-density-plasma CVD (HDP-CVD) and sub-atmospheric CVD (SACVD), or spin-on process. In addition, the transistors (for example, NMOS 102 and the PMOS 104) and the isolation structures 106 are formed in the semiconductor substrate 101 during the front-end-of-line (FEOL) processes, in accordance with some embodiments.

In some embodiments, the semiconductor structure 10 includes an interconnect structure 110, the interconnect structure 110 includes multiple layers each comprising an insulation layer 112 and metallization structures 114 embedded in the insulation layer 112. As shown in FIG. 1, the insulation layer 112 and the metallization structures 114 are disposed over the transistors formed in the semiconductor substrate 101. In some embodiments, a material of the insulation layer 112 includes dielectric material such as silicon oxide, a spin-on dielectric material, a low-k dielectric material or a combination thereof. The insulation layer 112 thus may be referred to as an interlayer dielectric (ILD) layer. The formation of the insulation layer 112 includes performing one or more processes by CVD or by spin-on, for example. In some embodiments, the metallization structures 114 include metal lines, vias and/or contact plugs. The materials of the metallization structures 114 may include aluminum (Al), aluminum alloys, copper (Cu), copper alloys, tungsten (W), or combinations thereof.

In exemplary embodiments, the transistors such as the NMOS 102 and the PMOS 104 are electrically connected with the metallization structures 114 and further electrically connected through the metallization structures 114 to at least one of a gate electrode, a source electrode, and a drain electrode of one or more, or each, of the thin film transistors to be formed. It is understood that metallization structures 114 shown herein are merely for illustrative purposes and the metallization structures 114 may include other configurations and may include one or more through vias and/or damascene structures.

In some embodiments, the semiconductor structure 10 further includes a semiconductor device 15 formed over the interconnect structure 110. For example, the semiconductor device 15 is formed over the topmost insulation layer of the insulation layer 112 and in direct contact with the topmost metallization structure of the metallization structures 114 (not shown). In some embodiments, the semiconductor device 15 are wrapped around by an ILD layer 122, and an interconnect structure 130 is formed over the semiconductor device 15 and the ILD layer 122. As shown in FIG. 1, the interconnect structure 130 may be similar to the interconnect structure 110 and include insulation layers 132 and metallization structures 134. In some embodiments, the interconnect structure 110 and the interconnect structure 130 can be respectively referred to as a lower interconnect structure and an upper interconnect structure, and the semiconductor device 15 between the interconnect structure 110 and the interconnect structure 130 can be referred to as a back-end device. In some embodiments, the semiconductor device 15 are electrically connected to the he interconnect structure 110 and the interconnect structure 130. In FIG. 1, the details of the semiconductor device are not shown and further details will be described later in subsequent figures.

FIG. 2 through FIG. 6 are schematic cross-sectional views of various stages in a manufacturing method of a semiconductor device 20 in accordance with some embodiments of the disclosure. For simplicity, portions of the semiconductor structure below the semiconductor device 15 are omitted in FIG. 2 through FIG. 6, and the portions of the semiconductor structure 10 can be referred to as, for example, a semiconductor base structure. In addition, it is understood that additional operations can be provided before, during, and after processes shown by FIG. 2 through FIG. 6, and some of the operations described below can be replaced or eliminated, for additional embodiments of the method. The order of the operations/processes may be interchangeable. The semiconductor device depicted in the following paragraphs may be used as the semiconductor device in FIG. 1.

Figure 2:
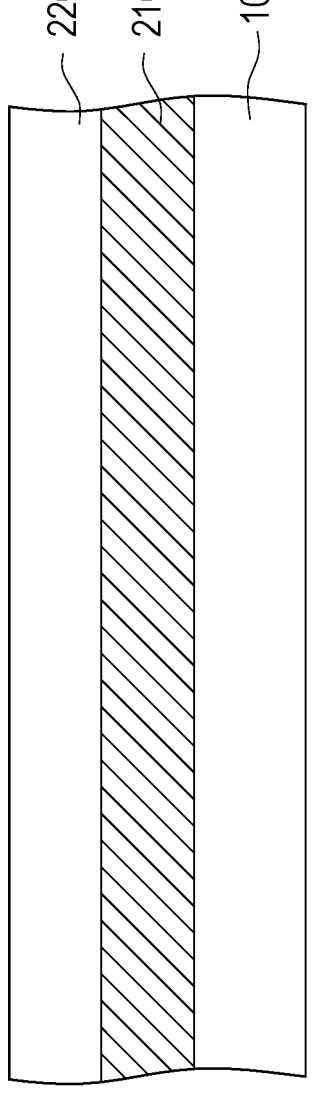
FIG. 2 through FIG. 6 are schematic cross-sectional views of various stages in a manufacturing method of a semiconductor device in accordance with some embodiments of the disclosure.

Referring to FIG. 2, a gate material layer 210 is blanketly formed over the portions of the semiconductor structure 10 (for example, on the topmost insulation layer of the insulation layer 112). In some embodiments, the gate material layer 210 includes one or more metallic material layers. For example, the materials of the gate material layer 210 include aluminum (Al), titanium (Ti), tungsten (W), tantalum (Ta), nitride thereof, combinations thereof, and/or alloys thereof. In certain embodiments, the gate material layer 210 includes one or more stacked layers of TiN, TaN, W/TiN, TiN/TiAl/TiN or TiN/TiAl/TaN. In some embodiments, the formation of the gate material layer 210 includes one or more deposition processes selected from CVD (such as, PECVD and laser-assisted CVD), ALD, and physical vapor deposition (PVD) (such as, sputtering and e-beam evaporation). Alternatively, the formation of the gate material layer 210 may include a plating process. In some embodiments, the gate material layer 210 is formed with a thickness ranging from about 10 nm to about 150 nm.

As shown in FIG. 2, a gate insulator material layer 220 is formed over the gate material layer 210. In some embodiments, the gate insulator material layer 220 includes one or more stacked layers of dielectric material. In some embodiments, the dielectric material of the gate insulator material layer 220 includes one or more oxide-based dielectric materials, such as hafnium zirconium oxide ($HfO_x:ZrO_x$), hafnium aluminum oxide ($HfO_x:AlO_x$), hafnium lanthanum oxide ($HfO_x:LaO_x$), hafnium silicon oxide ($HfO_x:SiO_x$), hafnium strontium oxide ($HfO_x:SrO$). In some embodiments, the dielectric material of the gate insulator material layer 220 includes $SiO_x$, or $AlO_x$. In some embodiments, the dielectric material of the gate insulator material layer 220 includes hafnium zirconium oxide (e.g., $Hf_xZr_{1-x}O_2$ or $H_2O$) doped cerium oxide (e.g., $CeO_x$). In some embodiments, the formation of the gate insulator material layer 220 includes one or more deposition processes selected from CVD (such as, PECVD and laser-assisted CVD), ALD and PVD (such as, sputtering and e-beam evaporation). In some embodiments, the gate insulator material layer 220 is formed with a thickness ranging from about 1 nm to about 10 nm.

Figure 3:
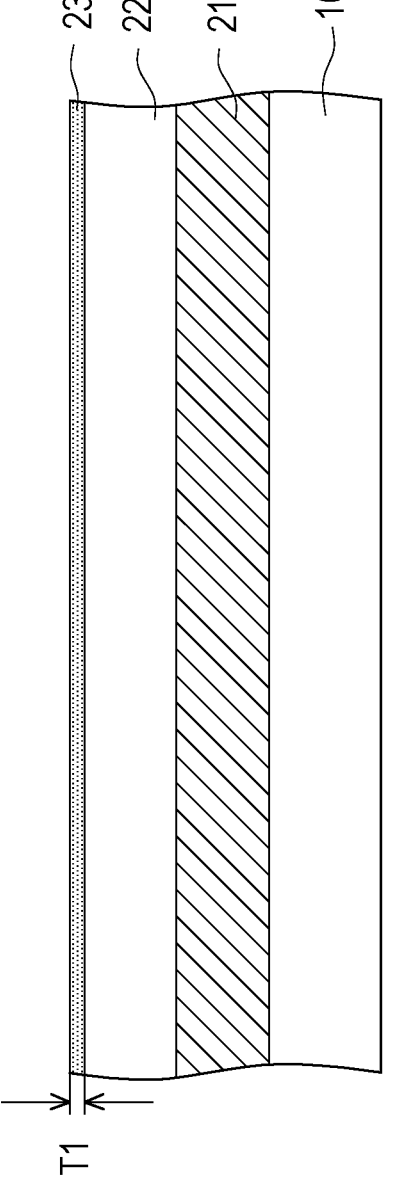

Referring to FIG. 3, after forming the gate insulator material layer 220, an interfacial material layer 230 is formed over the gate insulator material layer 220. In some embodiments, the interfacial material layer 230 is formed as a single layer or few layers. In some embodiments, the material of the interfacial material layer 230 includes an oxide material selected from zinc oxide (e.g., ZnO), aluminum oxide (e.g., $Al_2O_3$), indium oxide (e.g., $In_2O_3$), hafnium oxide (e.g., HfO), zirconium oxide (e.g., ZrO), gallium oxide (e.g., GaO), lanthanum oxide (e.g., $La_2O_3$), yttrium oxide (e.g., $Y_2O_3$), tantalum oxide (e.g., $Ta_2O_5$) or a combination thereof. In some embodiments, the material of the interfacial material layer 230 includes silicon oxide. In some embodiments, the formation of the interfacial material layer 230 includes one or more deposition processes selected from CVD (such as, PECVD and laser-assisted CVD), ALD and PVD (such as, sputtering and e-beam evaporation). In some embodiments, the interfacial material layer 230 is formed with a thickness T1 which is less than about 2 nm.

Figure 4:
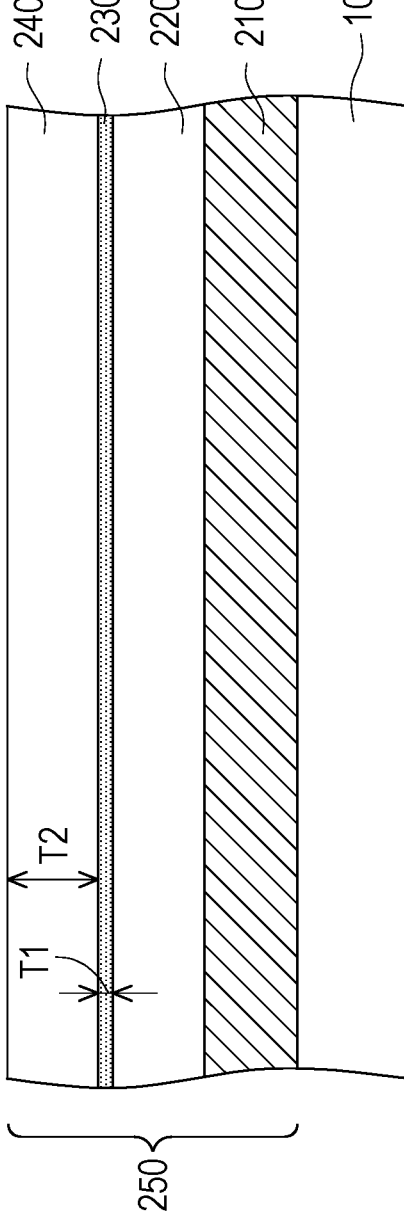

Referring to FIG. 4, an active material layer 240 is then formed over the interfacial material layer 230. In some embodiments, the active material layer 240 includes semiconductor material. For example, the material of the active material layer 240 includes silicon such as amorphous silicon or polycrystalline silicon. In some embodiments, the material of the active material layer 240 includes metal oxide such as indium zinc oxide (IZO), indium gallium oxide (IGO), indium gallium zinc oxide (IGZO), indium tungsten oxide (IWO), indium tungsten zinc oxide (IWZO) or a combination thereof. In some embodiments, the formation of the active material layer 240 includes one or more deposition processes selected from CVD (such as, PECVD and laser-assisted CVD), ALD and PVD (such as, sputtering and e-beam evaporation). In certain embodiments, the active material layer 240 is formed to be at least ten times thicker than the interfacial material layer 230. For example, a thickness T2 of the active material layer 240 is greater than about 20 nm.

In some embodiments, the gate material layer 210, the gate insulator material layer 220, the interfacial material layer 230, and the active material layer 240 are sequentially deposited over the portions of the semiconductor structure 10 and form a material multi-layer stack 250.

Figure 5:
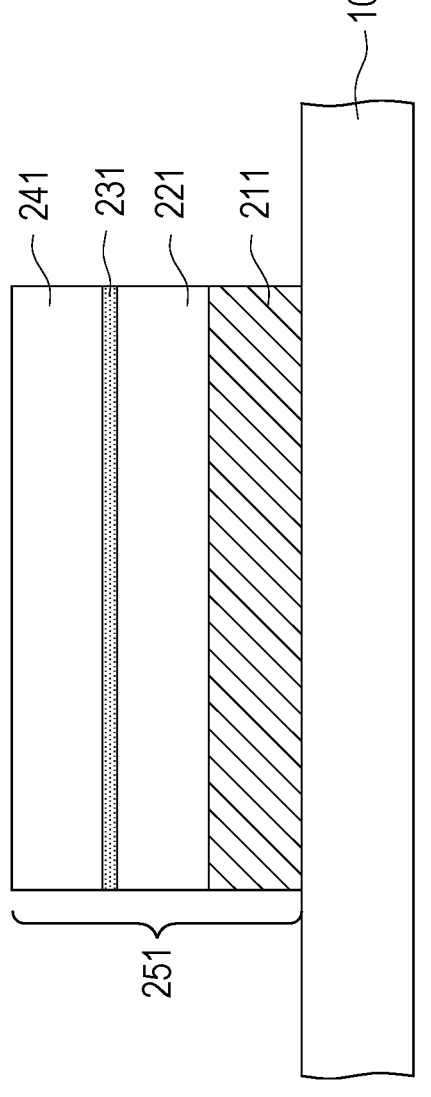

Referring to FIG. 5, in some embodiments, a patterning process is performed to the material multi-layer stack 250 of the gate material layer 210, the gate insulator material layer 220, the interfacial material layer 230, and the active material layer 240, so that the material multi-layer stack 250 is patterned to form a stack structure 251 including a gate layer 211, a gate insulator layer 221, an interfacial layer 231, and an active layer 241 stacked in sequence from the bottom to the top. In some embodiments, the material multi-layer stack 250 of the gate material layer 210, the gate insulator material layer 220, the interfacial material layer 230, and the active material layer 240 is patterned into the stack structure 251 in one continuous patterning process. Alternatively, the gate material layer 210, the gate insulator material layer 220, the interfacial material layer 230, and the active material layer 240 are sequentially patterned through multiple patterning processes, in accordance with some embodiments. In FIG. 5, sidewalls of the stack structure 251 may be shown to be vertically aligned or coplanar, and the stack structure 251 may be shown to be patterned into substantially the same pattern design or configuration. However, it is understood that the various layers of the stack structure 251 may have different patterns or configurations depending on product designs. In some embodiments, the patterning and the formation of the stack structure 251 include performing a photolithographic process and an anisotropic etching process. For example, a photoresist pattern (not shown) may be used as an etching mask so that portions of the material multi-layer stack 250 uncovered by the photoresist pattern are removed during the etching process, and the photoresist pattern is then removed thorough a stripping process or ashing process.

Figure 6:
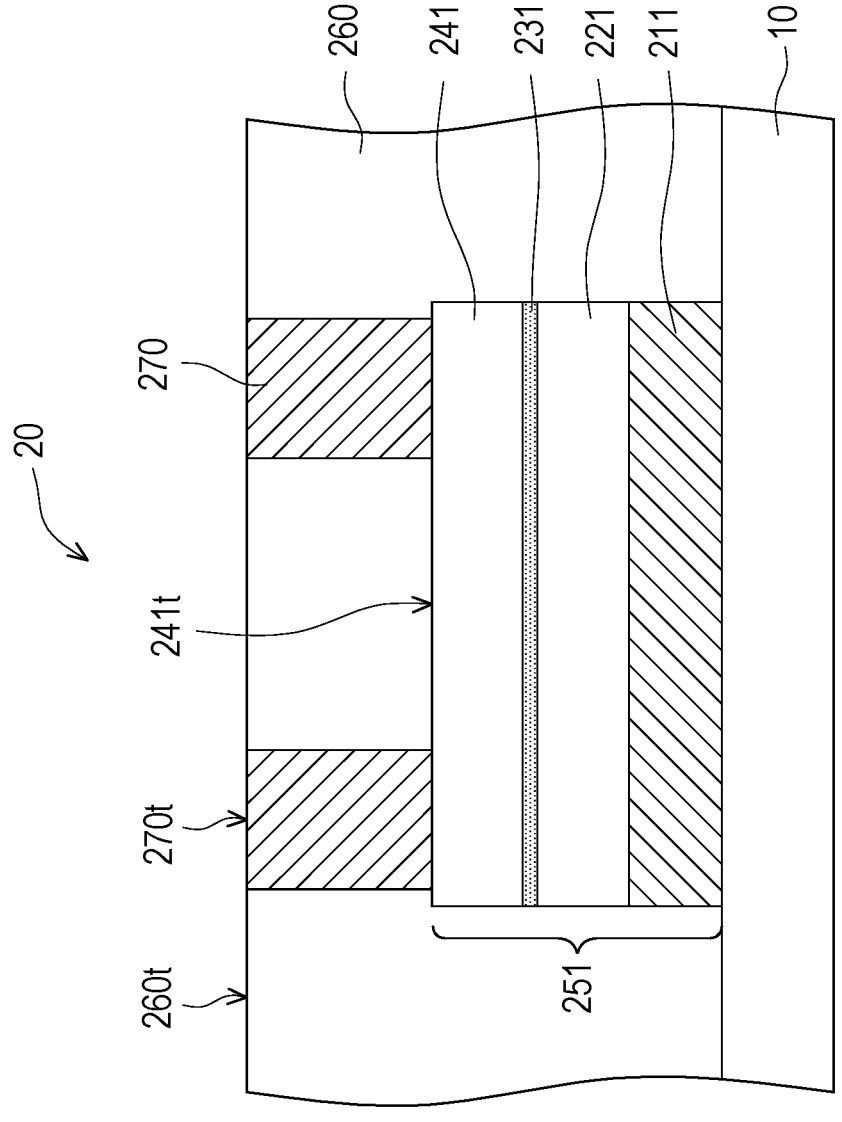

Referring to FIG. 6, an interlayer dielectric (ILD) layer 260 and a pair of contact structures 270 are formed over the portions of the semiconductor structure 10 (for example, on the topmost insulation layer of the insulation layer 112) and the stack structure 251. In some embodiments, the ILD layer 260 is first formed covering the exposed surface of the portions of the semiconductor structure 10 and the stack structure 251. In some embodiments, the material of the ILD layer 260 includes silicon oxide, silicon nitride, silicon oxynitride, or one or more low-k dielectric materials. Examples of low-k dielectric materials include silicate glass such as fluoro-silicate-glass (FSG), phospho-silicate-glass (PSG) and boro-phospho-silicate-glass (BPSG), BLACK DIAMOND®, SILK®, FLARE®, hydrogen silsesquioxane (HS Q), fluorinated silicon oxide (SiOF), amorphous fluorinated carbon, parylene, BCB (bis-benzocyclobutenes), or a combination thereof. It is understood that the ILD layer 260 may include one or more dielectric materials or one or more dielectric layers. In some embodiments, the ILD layer 260 is formed to a suitable thickness through CVD (such as flowable CVD (FCVD), PECVD, high density plasma CVD (HDPCVD), SACVD, and low-pressure CVD (LPCVD)), spin-on coating, or other suitable methods. Later, the contact structures 270 are formed in the ILD layer 260. The formation of the contact structures 270 includes forming contact openings (not shown) in the ILD layer 260 and then filling up the contact openings with a conductive material. For example, the contact openings are formed by forming a patterned mask layer (not shown) over the ILD layer 260, anisotropic etching the ILD layer 260 using the patterned mask layer as a mask to form contact openings exposing top surface 241*t* of the active layer 241.

Thereafter, contact structures 270 are formed in the contact openings and are in direct contact with the active layer 241. In some embodiments, the contact structures 270 are formed by depositing conductive material, such as metallic material, to fill up the contact openings. The contact structures 270 may include one or more metallic materials selected tungsten (W), ruthenium (Ru), molybdenum (Mo), tantalum (Ta), titanium (Ti), alloys thereof. In some embodiments, the metallic material is formed by CVD or PVD. In alternative embodiments, the formation of the metallic material may include performing a plating process (such as electrochemical plating (ECP)).

Still referring to FIG. 6, a planarization process such as chemical mechanical polishing (CMP) process or etch back process may be performed to remove the excess metallic material. As shown in FIG. 6, a top surface 260*t* of the ILD layer 260 is substantially coplanar with and levelled with the top surfaces 270*t* of the contact structures 270 after the planarization process is performed. The ILD layer 260 surrounds the stack structure 251 and the contact structures 270, as illustrated in FIG. 6. Further, the contact structures 270 are formed directly on the active layer 241 and formed with substantially vertical sidewalls. It is understood that the contact openings may be formed with slant sidewalls if feasible.

Up to here, a semiconductor device 20 in the semiconductor structure 10 is obtained. The semiconductor device 20 includes the stack structure 251 comprising the gate layer 211, the gate insulator layer 221, the interfacial layer 231, and the active layer 241 sequentially stacked from the bottom to the top, and the contact structures 270 located on the stack structure 251. In some embodiments, the gate layer 211 and the gate insulator layer 221 are collectively referred to as a back gate structure (or a bottom gate structure) of the semiconductor device 20. Further, the active layer 241 functions as a channel layer of the semiconductor device 20 and the contact structures 270 function as the source and drain structures of the semiconductor device 20. In some embodiments, the semiconductor device 20 includes a bottom-gated transistor structure or a back-gate transistor structure.

Depending on the material for the interfacial layer 231, the interfacial layer 231 may be implemented to provide positive carriers or negative carriers to the overlying active layer 214, thus may be referred to as a charged layer. The positive carriers or negative carriers provided to the active layer 214 may result in the shift (for example, positive shift or negative shift) of the threshold voltage of the semiconductor device 20. In other words, by employing the interfacial layer 231 adjacent to the active layer 241, the threshold voltage of the semiconductor device 20 can be adjusted or controlled, such that various threshold voltages for multiple semiconductor devices (e.g., transistor structures) in the semiconductor structure 10 are feasible. Therefore, the interfacial layer 231 may also be referred to as a threshold voltage tuning layer.

In embodiments where the semiconductor device includes a N-type active layer, if the interfacial layer is used to provide the N-type active layer with the negative carriers, the threshold voltage of such semiconductor device will be lowered. On the other hand, if the interfacial layer is used to provide the N-type active layer with the positive carriers, the threshold voltage of the semiconductor device will be increased.

Although the semiconductor device 20 are shown as structure in FIG. 6, it is understood that additional interconnect structure (for example, upper-level interconnect structure) may be formed over the ILD layer 260 and over the contact structures 270 for further electrical connection. In the illustrated embodiments, the described methods and structures may be formed compatible with the current semiconductor manufacturing processes. In exemplary embodiments, the described methods and structures are formed during back-end-of-line (BEOL) processes. Alternatively, the described methods and structures may be formed during middle-of-line (MEOL) processes.

Figure 7:
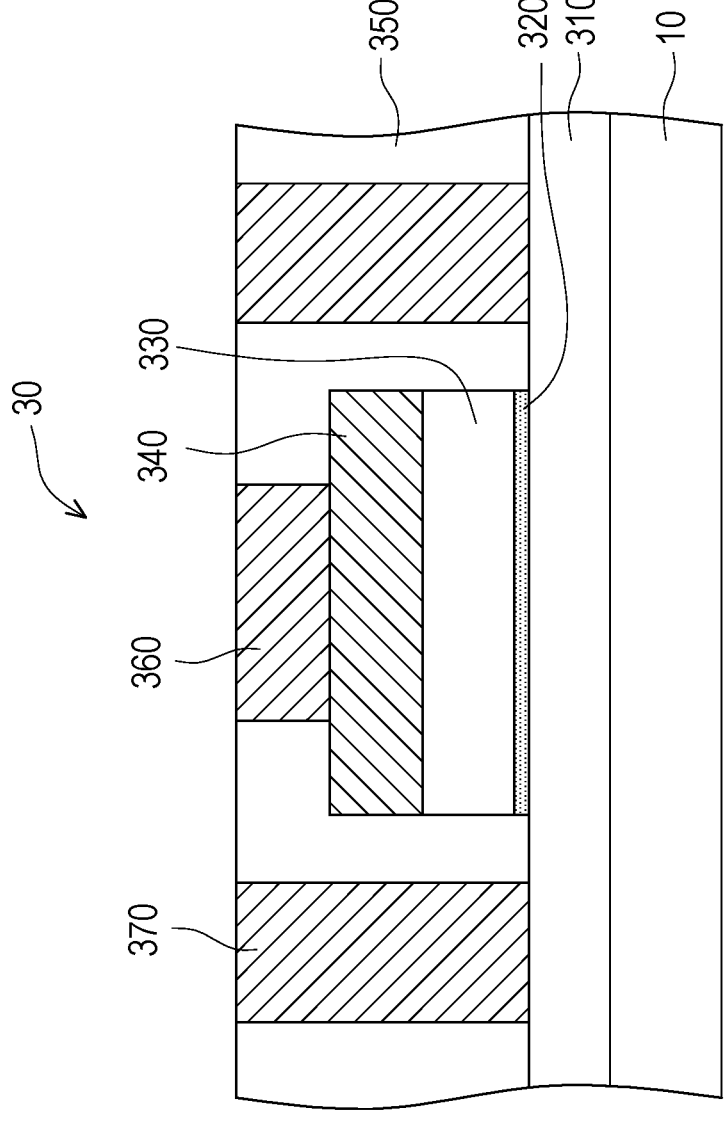
FIG. 7 through FIG. 10 are schematic cross-sectional views showing a semiconductor device in accordance with some embodiments of the disclosure.

FIG. 7 is a schematic cross-sectional view showing a semiconductor device 30 in accordance with some embodiments of the disclosure. In some embodiments, the semiconductor device 30 may be used as the semiconductor device in FIG. 1. As shown in FIG. 7, the semiconductor device 30 may include a top-gated transistor structure or a front-gate transistor structure. The semiconductor device 30 may be formed, for example, by first depositing an active layer 310 over the portions of the semiconductor structure 10 (for example, on the topmost insulation layer of the insulation layer 112). In some embodiments, the active layer 310 includes similar or substantially the same material as the active material layer 240 of the semiconductor device 20. An interfacial material layer, a gate insulator material layer, and a gate material layer are then sequentially deposited on the active layer 310. In some embodiments, the interfacial material layer, the gate insulator material layer, and the gate material layer respectively includes similar or substantially the same materials as those in the semiconductor device 20 described above. Thereafter, the interfacial material layer, the gate insulator material layer, and the gate material layer are patterned together to form a multi-layer stack of an interfacial layer 320, a gate insulator layer 330, and a gate layer 340. As shown in FIG. 7, opposite sidewalls of the interfacial layer 320, the gate insulator layer 330, and the gate layer 340 are vertically aligned with one another.

Further, an ILD layer 350 is formed over the active layer 310 to wrap around the multi-layer stack of the interfacial layer 320, the gate insulator layer 330, and the gate layer 340. A first contact structure 360 and a pair of second contact structures 370 are formed extending the ILD layer 350 to respectively contact the gate layer 340 and the active layer 310. In FIG. 7, the pair of second contact structures 370 is located on opposite sides of the multi-layer stack comprising the interfacial layer 320, the gate insulator layer 330, and the gate layer 340. In some embodiments, the ILD layer 350 is similar to, or the same as the ILD layer 260 of the semiconductor device 20. In some embodiments, the first and second contact structures 360, 370 include similar or substantially the same material as the contact structures 270 of the semiconductor device 20 and are formed using similar or substantially the same processes. As shown in FIG. 7, the first contact structure 360 is in direct contact with the gate layer 340 and thus can be referred to as a gate contact structure, and the pair of second contact structures 370 is in direct contact with the active layer 310 and may function as a source structure and a drain structure.

Figure 8:
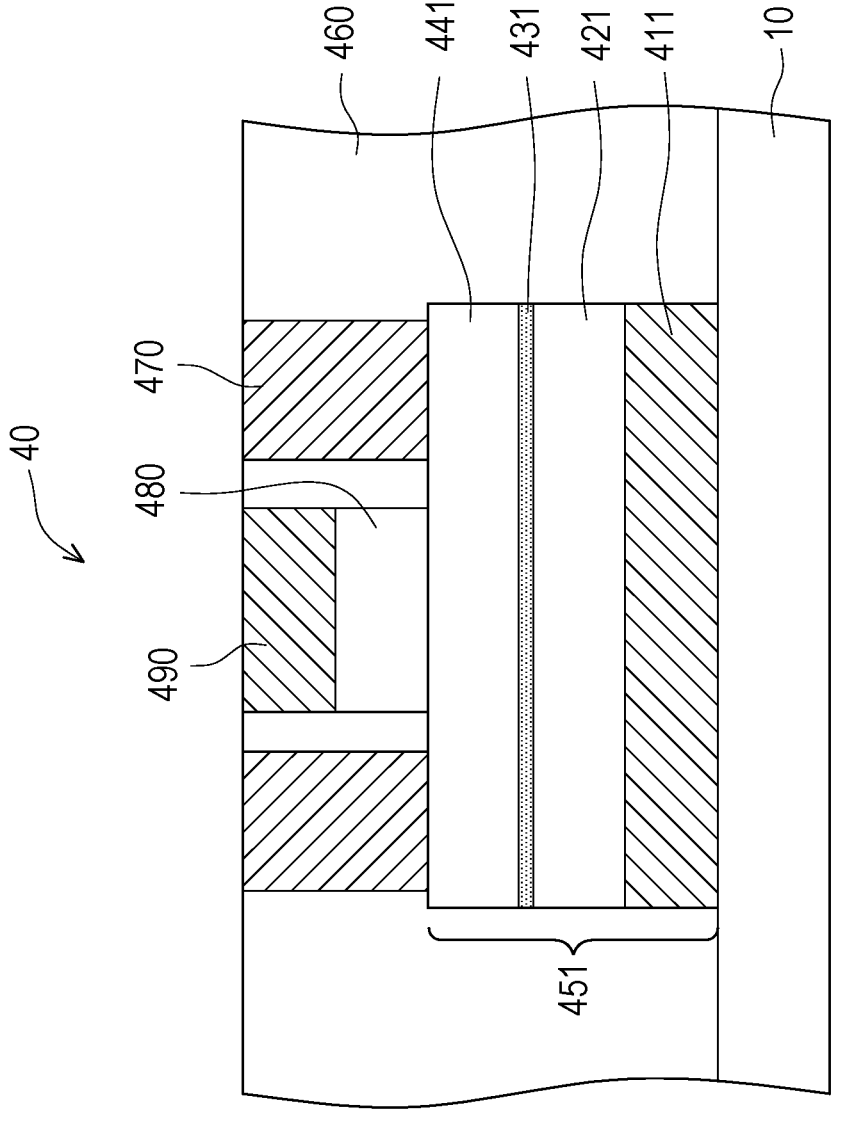

FIG. 8 is a schematic cross-sectional view showing a semiconductor device 40 in accordance with some embodiments of the disclosure. The semiconductor device 40 may be similar to the semiconductor device 20 described above with reference to FIG. 2 through FIG. 6, and thus only the differences are detailed. In some embodiments, the semiconductor device 40 is a dual-gate device. As illustrated in FIG. 8, the semiconductor device 40 includes a stack structure 451 over the portions of the semiconductor structure 10 and a pair of contact structures 470 over the stack structure 451, the stack structure 451 and the pair of contact structures 470 are embedded in an ILD layer 460. The ILD layer 460 and the contact structures 470 are respectively similar or substantially the same as the ILD layer 260 and the contact structures 270 of the semiconductor device 20. Similar to the stack structure 251 of the semiconductor device 20, the stack structure 451 includes a gate layer 411, a gate insulator layer 421, a interfacial layer 431, and an active layer 441 stacked in sequence from the bottom to the top. As shown in FIG. 8, the semiconductor device 40 further includes a front gate structure (or a top gate structure) disposed over the stack structure 451 and between the contact structures 470. The front gate structure is opposite to the back gate structure and includes a gate insulator layer 480 and a gate layer 490.

In some embodiments, the formation of the front gate structure may be prior to the formation of the ILD layer 460 and the contact structures 470. For example, a gate insulator material layer and a gate material layer may be sequentially deposited on the active layer 441 from the bottom to the top after the stack structure 451 is formed. The gate insulator material layer and a gate material layer may include similar or substantially the same materials as the gate insulator material layer 220 and the gate material layer 210 respectively, with reference of FIG. 2, and may be formed using similar or substantially the same processes. As seen in FIG. 8, the gate insulator material layer and the gate material layer are patterned to form the gate insulator layer 480 and the gate layer 490, and sidewalls of the gate insulator layer 480 and the gate layer 490 together form continuous flush sidewalls. In illustrated embodiments, a lateral dimension of the front gate structure is smaller than that of the back gate structure.

Figure 9:
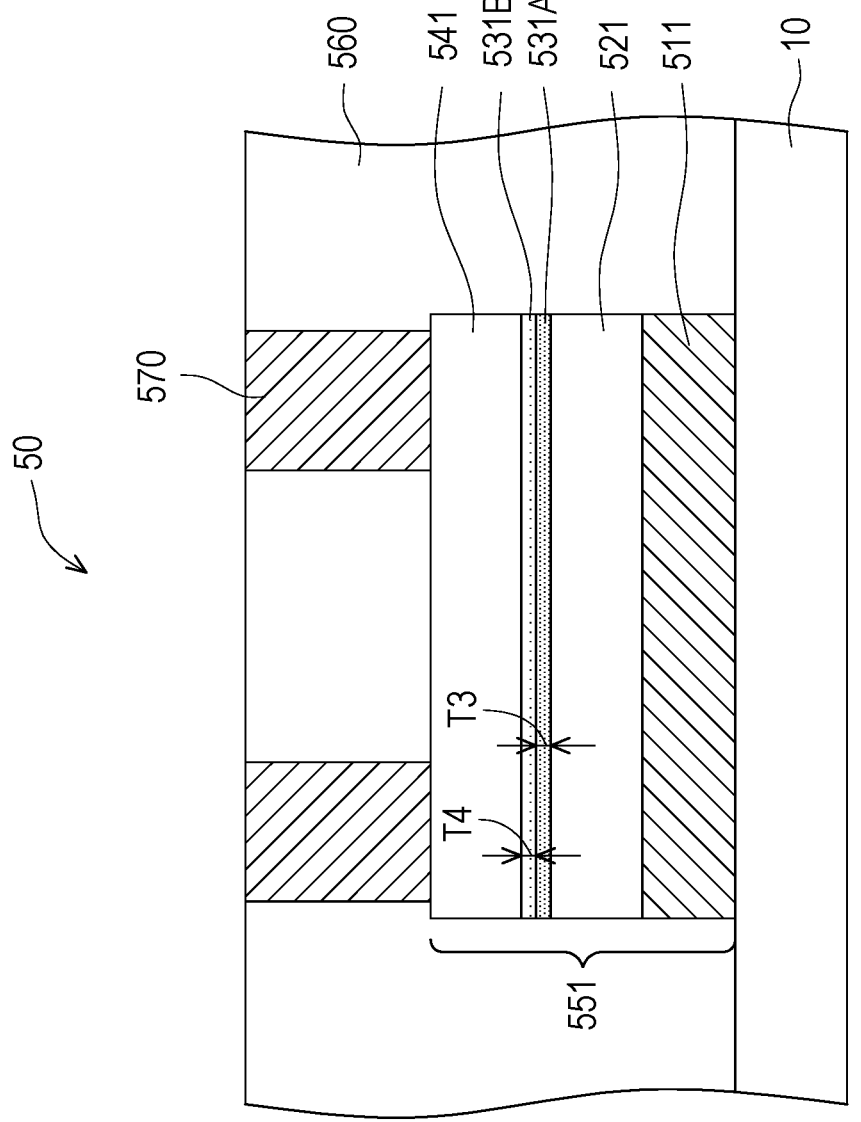

FIG. 9 is a schematic cross-sectional view showing a semiconductor device 50 in accordance with some embodiments of the disclosure. The semiconductor device 50 may be similar to the semiconductor device 20 described above with reference to FIG. 2 through FIG. 6, and thus only the differences are detailed. As illustrated in FIG. 9, the semiconductor device 50 includes a stack structure 551 that is similar to the stack structure 251 of the semiconductor device 20. The only difference between the stack structure 551 and the stack structure 251 lies in that there are two distinct interfacial layers formed between a gate insulator layer 521 and an active layer 541. For example, the stack structure 551 includes a first interfacial layer 531A adjacent to the gate insulator layer 521 and a second interfacial layer 531B adjacent to the active layer 541.

In some embodiments, the first interfacial layer 531A and the second interfacial layer 531B are monolayers that respectively include a semiconductor-like interfacial material and a dielectric-like interfacial material. Herein, the semiconductor-like interfacial material of the first interfacial layer 531A and the dielectric-like interfacial material of the second interfacial layer 531B are both selected from the material that described above with reference to the material of the interfacial material layer 230 in FIG. 3. In some embodiments, the semiconductor-like interfacial material of the first interfacial layer 531A refers to material having a band gap less than 3 eV, such as $Al_2O_3$, ZnO, $In_2O_3$, GaO, and/or $W_2O_3$. In some embodiments, the second interfacial layer 531B refers to material having a band gap greater than 6 eV, such as HfO, ZrO, $La_2O_3$, $SiO_2$, $Y_2O_3$, and/or $Ta_2O_5$. Further, in some embodiments, the first interfacial layer 531A and the second interfacial layer 531B respectively has a thickness T3 and a thickness T4, and both the thickness T3 and T4 are less than about 2 nm.

In addition, the semiconductor device 50 includes an ILD layer 560 formed over the portions of the semiconductor structure 10 and the stack structure 551 and a pair of contact structures 570 extending through the ILD layer and in direct contact with the active layer 541 of the stack structure 551. The ILD layer 560 and the contact structures 570 are similar to the ILD layer 260 and the contact structures 270 described above with reference to FIG. 6, thus the description is not repeated herein.

It is understood that exemplary stack configuration in embodiment described above with reference to FIG. 9 can be implemented in a front-gate transistor structure or a dual-gate transistor structure as well, the disclosure is not limited thereto.

Figure 10:
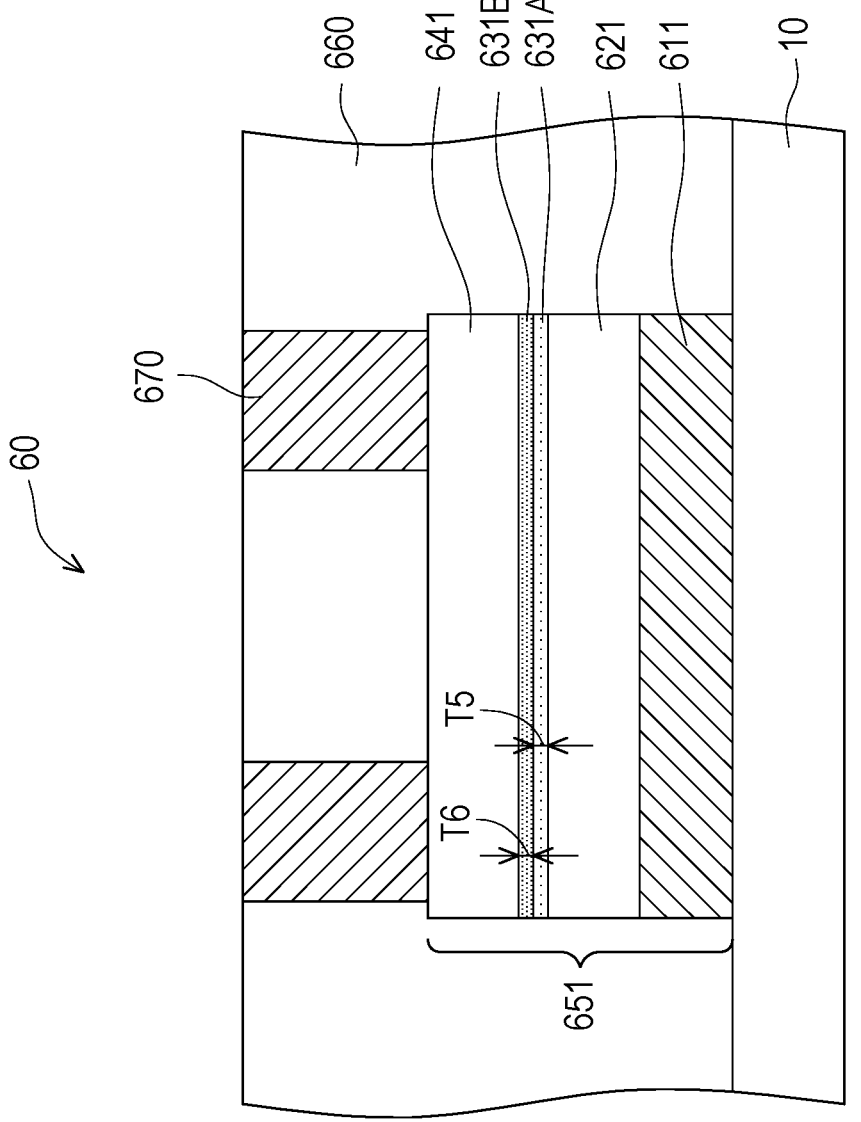

FIG. 10 is a schematic cross-sectional view showing a semiconductor device 60 in accordance with some embodiments of the disclosure. The semiconductor device 60 may be similar to the semiconductor device 50 described above with reference to FIG. 9, and thus only the differences are detailed. In FIG. 10, the semiconductor device 60 includes a stack structure 651 that is similar to the stack structure 551 of the semiconductor device 50. The only difference between the stack structure 651 and the stack structure 551 lies in that a first interfacial layer 631A adjacent to the gate insulator layer 621 includes the dielectric-like interfacial material and a second interfacial layer 631B adjacent to the active layer 641 includes the semiconductor-like interfacial material. In other words, the first interfacial layer 631A may include $Al_2O_3$, ZnO, $In_2O_3$, GaO, and/or $W_2O_3$, and the second interfacial layer 631B may include HfO, ZrO, $La_2O_3$, $SiO_2$, $Y_2O_3$, and/or $Ta_2O_5$. In some embodiments, the first interfacial layer 631A and the second interfacial layer 631B respectively has a thickness T5 and a thickness T6, and both the thickness T5 and T6 are less than about 2 nm.

In addition, the semiconductor device 60 includes an ILD layer 660 formed over the portions of the semiconductor structure 10 and the stack structure 651 and a pair of contact structures 670 extending through the ILD layer and in direct contact with the active layer 641 of the stack structure 651. The ILD layer 660 and the contact structures 670 are similar to the ILD layer 660 and the contact structures 670 described above with reference to FIG. 6, thus the description is not repeated herein.

It is understood that exemplary stack configuration in embodiment described above with reference to FIG. 10 can be implemented in a front-gate transistor structure or a dual-gate transistor structure as well, the disclosure is not limited thereto.

The embodiments shown in FIG. 6 and FIGS. 9-10 indicate that there can be single or more than one interfacial layer between the gate insulator layer and the active layer. Taking bilayer interfacial layer for examples, different materials can be respectively chosen for the two interfacial layers to modulate the threshold voltage of the as-obtained transistor, depending on the design requirements. Generally, threshold voltage shift in a semiconductor device is most sensitive to the material or the properties of the closest interfacial layer to the active layer (i.e., the one that directly contacts the active layer), for example.

FIG. 11 through FIG. 15 are schematic cross-sectional views of various stages in a manufacturing method of a semiconductor device 70 in accordance with some embodiments of the disclosure. Similarly, portions of the semiconductor structure 10 are omitted in FIG. 11 through FIG. 15 for simplicity. In addition, it is understood that additional operations can be provided before, during, and after processes shown by FIG. 11 through FIG. 15, and some of the operations described below can be replaced or eliminated, for additional embodiments of the method. The order of the operations/processes may be interchangeable. The semiconductor device depicted in the following paragraphs may be used as the semiconductor device in FIG. 1.

Figure 11:
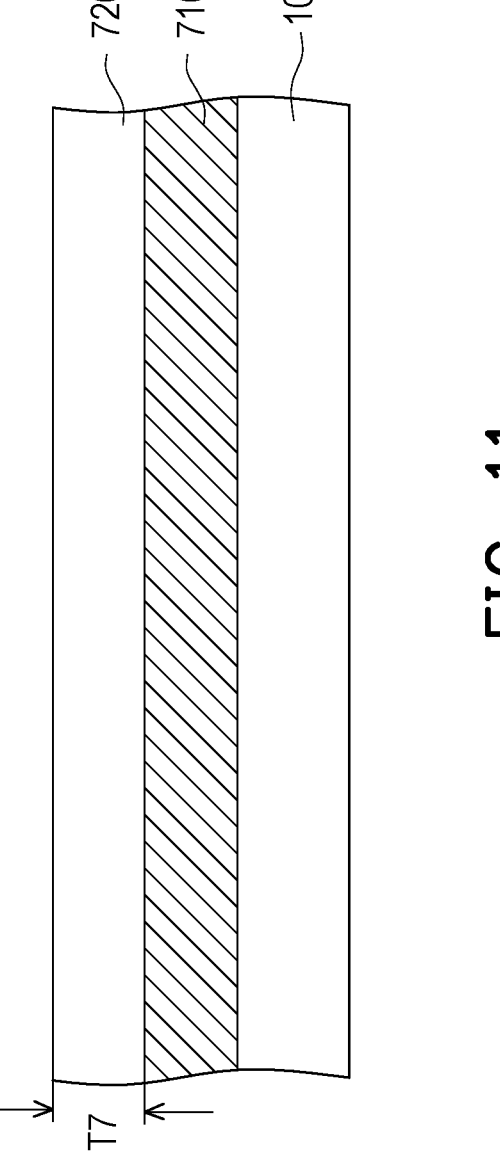
FIG. 11 through FIG. 15 are schematic cross-sectional views of various stages in a manufacturing method of a semiconductor device in accordance with some embodiments of the disclosure.

Referring to FIG. 11, a gate material layer 710 and a gate insulator material layer 720 is formed over the semiconductor structure 10 (for example, on the topmost insulation layer of the insulation layer 112). In some embodiments, the gate material layer 710 and the gate insulator material layer 720 are respectively formed of similar or substantially the same materials as the gate material layer 210 and the gate insulator material layer 220 described above with reference to FIG. 2 through similar or substantially the same processes, thus the description is not repeated herein. Further, in some embodiments, the gate insulator material layer 720 is formed with a thickness T7 ranging from about 1 nm to about 10 nm.

Figure 12:
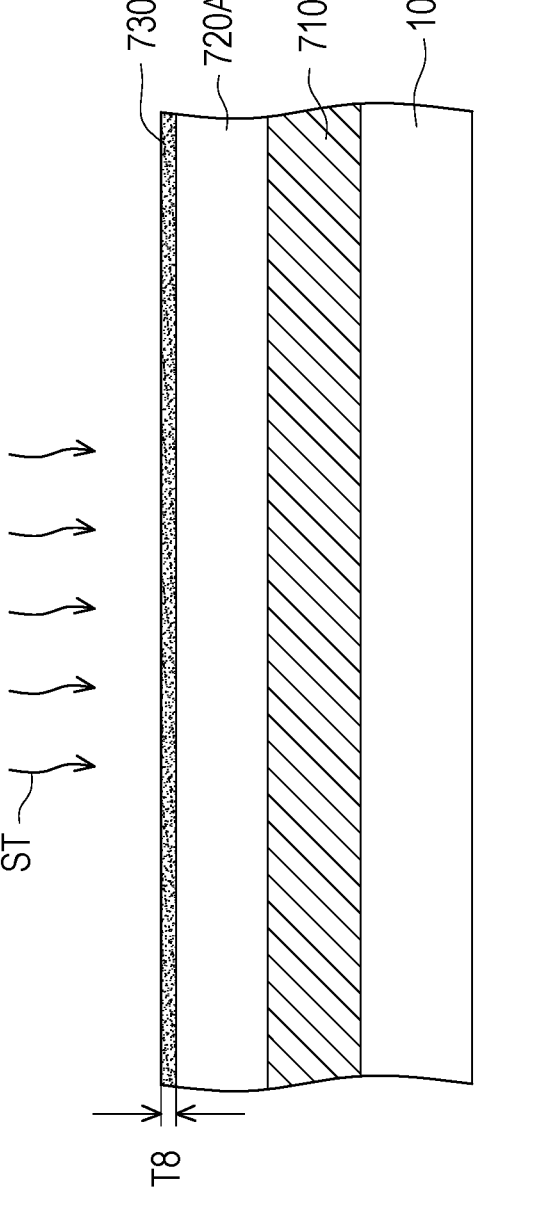

Referring to FIG. 12, subsequent to the formation of the gate insulator material layer 720, a surface treatment process ST is performed on the top surface of the gate insulator material layer 720. The surface treatment process ST may include a plasma surface treatment using such as $O_2$ plasma, $N_2O$ plasma, or $NH_3$ plasma, or a chemical surface treatment using ozone, or any suitable surface treatment process ST. In some embodiments, after the surface treatment process ST, an upper portion of the gate insulator material layer 720 that went through the surface treatment process ST turns into an interfacial layer 730, so as to form the gate insulator material layer 720A (i.e. the remained portion of the gate insulator material layer 720). In some embodiments, the interfacial layer 730 has a thickness T8, and the thickness T8 is less than about 2 nm.

In some embodiments, as the surface treatment process ST reduces the oxygen vacancies in the upper portion of the insulator material layer 720, the interfacial layer 730 has a reduced oxygen vacancy concentration after the surface treatment process ST is performed. The change in the oxygen vacancy concentration results in the shift of the threshold voltage of the later formed semiconductor device. By doing so, the desired threshold voltage of the semiconductor device later formed may be adjusted or shifted. In other words, the interfacial layer 730 has an oxygen (atom) content higher than that of the remained gate insulator material layer 720A.

Figure 13:
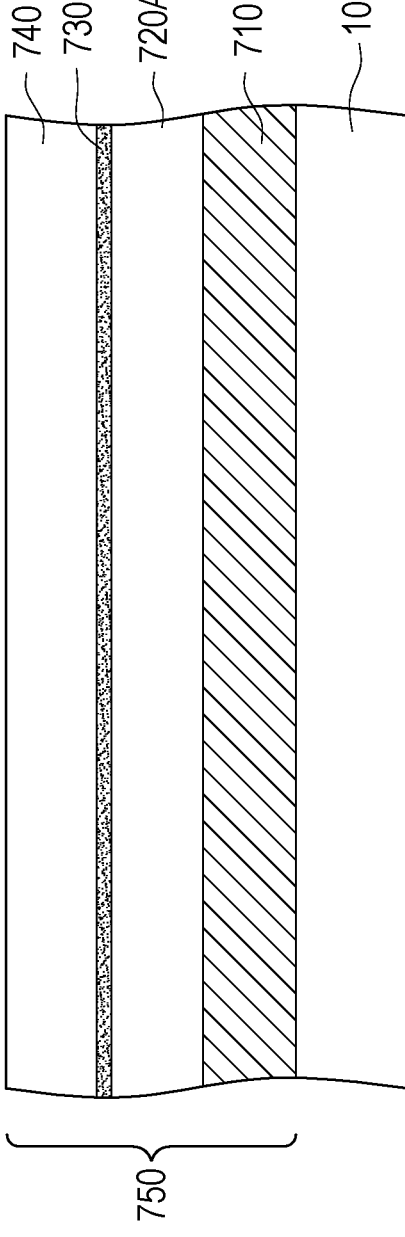

Referring to FIG. 13, an active material layer 740 is formed over the interfacial layer 730 after the surface treatment process ST is performed. In some embodiments, the active material layer 740 is formed of similar or substantially the same material as the active material layer 240 described above with reference to FIG. 4 through similar or substantially the same process, thus the description is not repeated herein. In some embodiments, the gate material layer 710, the remained gate insulator material layer 720A, the interfacial layer 730, and the active material layer 740 are sequentially deposited over the semiconductor structure 10 and form a material multi-layer stack 750.

Figure 14:
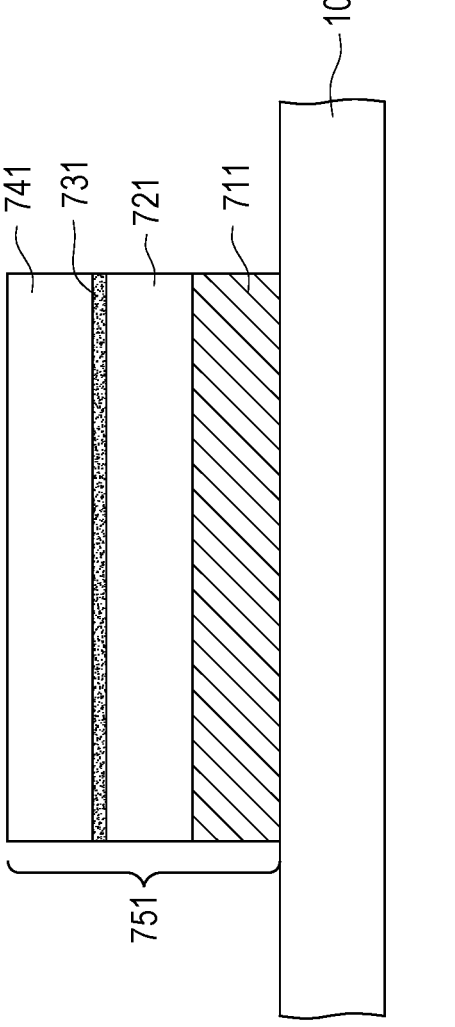

Referring to FIG. 14, the material multi-layer stack 750 is patterned to form a stack structure 751, and the stack structure 751 includes a gate layer 711, a gate insulator layer 721, an interfacial layer 731, and an active layer 741 sequentially stacked from bottom to top. The patterning process for forming the stack structure 751 may be similar to or substantially the same as that for forming the stack structure 251 described above with reference to FIG. 5, thus the description is not repeated herein. In some embodiments, the stack structure 751 may have vertical or tapered sidewalls, depending on the process condition.

Figure 15:
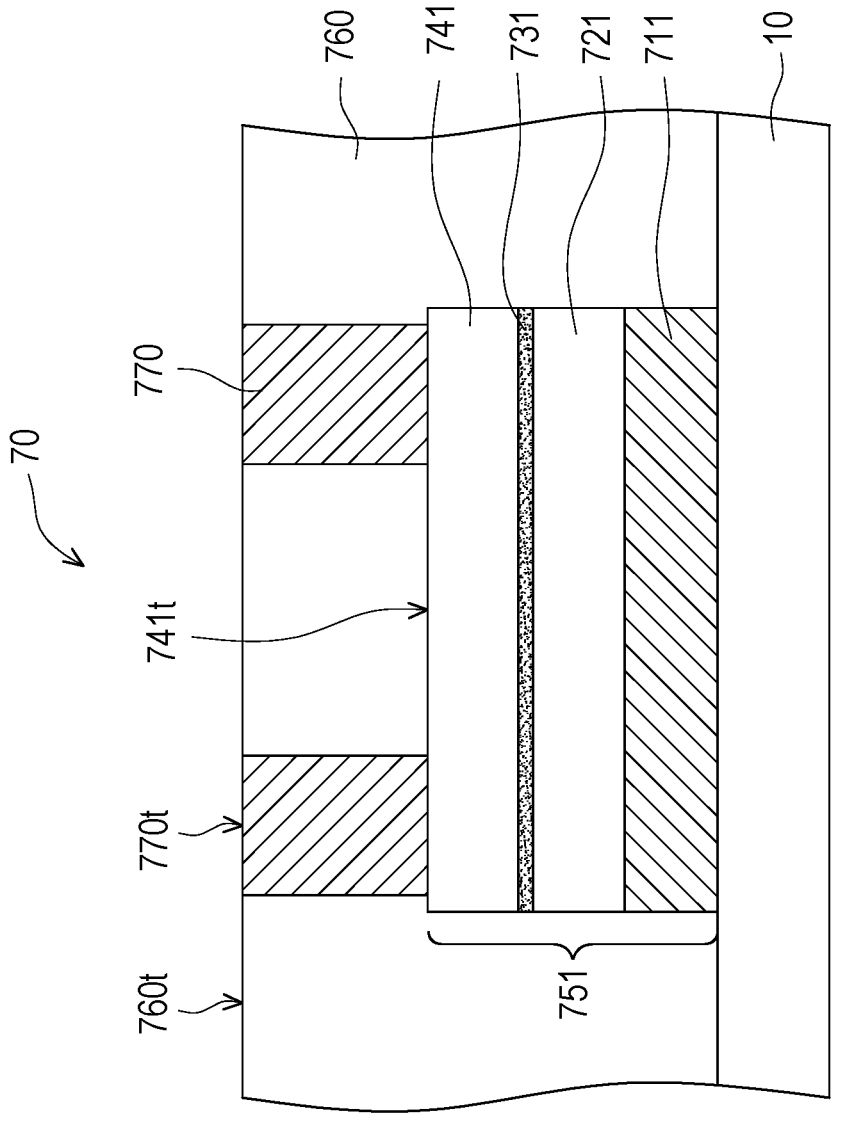

Referring to FIG. 15, an ILD layer 760 and a pair of contact structures 770 are formed over the semiconductor structure 10. The ILD layer 760 is formed covering top surfaces of the semiconductor structure 10 and the stack structure 751 and sidewalls of the stack structure 751, and the contact structures 770 are formed extending through the ILD layer 760 to directly contact the stack structure 751 (e.g., the active layer 741). In some embodiments, the ILD layer 760 and the contact structures 770 are respectively formed of similar or substantially the same materials as the ILD layer 260 and the contact structures 270 as described above with reference to FIG. 6 through similar or substantially the same processes.

As shown in FIG. 15, the semiconductor device 70 is formed, and the semiconductor device 70 at least includes the gate layer 711 and the gate insulator layer 721 collectively functioned as a back gate structure (or a bottom gate structure) of the semiconductor device 70, the active layer 741 functioned as the channel layer of the semiconductor device 70, the interfacial layer 731 between the gate insulator layer 721 and the active layer 741, and the contact structures 770 functioned as the source and drain structure of the semiconductor device 70.

Similarly, it is understood that additional interconnect structure (for example, upper-level interconnect structure) may be formed over the ILD layer 760 and over the contact structures 770 for further electrical connection. In addition, in embodiments where a front-gate transistor structure or a dual-gate transistor structure is used, the afore-mentioned surface treatment can also be performed, and the disclosure is not limited thereto.

In accordance with an embodiment of the disclosure, a semiconductor structure is described. The semiconductor structure includes an active layer, a first gate insulator layer disposed over the active layer, a first gate layer disposed over the gate insulator layer, at least one charged layer disposed between the first gate insulator layer and the active layer, and a pair of contact structures disposed over the active layer. The at least one charged layer includes an oxide material.

In accordance with an embodiment of the disclosure, a semiconductor structure is described. The semiconductor structure includes at least one first transistor structure and a second transistor structure disposed over the at least one first transistor structure and electrically connected to the at least one first transistor structure through an interconnect structure. The second transistor structure includes a semiconductor channel layer, a multi-layer stack disposed over the semiconductor channel layer, and source and drain structures disposed over the semiconductor channel layer. The multi-layer stack includes a first gate layer, a first gate dielectric layer, a first threshold voltage tuning layer, and a second threshold voltage tuning layer sequentially stacked.

In accordance with yet another embodiment of the disclosure, a method of manufacturing a semiconductor structure is described. The method includes at least the following steps. A first gate layer is formed over a semiconductor base structure. A first gate dielectric layer is formed on the first gate layer. An interfacial layer is formed on or within the first gate dielectric layer. An active layer is formed on the interfacial layer, wherein a plurality of carriers is provided from the interfacial layer to the active layer. An interlayer dielectric layer is formed over the semiconductor base structure that covers the first gate layer, the first gate dielectric layer, the interfacial layer, and the active layer. A pair of contact structures is formed extending through the interlayer dielectric layer and in contact with the active layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an active layer;
   a first gate insulator layer disposed over the active layer;
   a first gate layer disposed over the first gate insulator layer;
   at least one charged layer disposed between the first gate insulator layer and the active layer, wherein the first gate insulator layer and the active layer are disposed at opposite sides of the at least one charged layer, and the at least one charged layer includes an oxide material; and
   a pair of contact structures disposed over the active layer.

2. The semiconductor structure of claim 1, wherein the at least one charged layer comprises a first charged layer adjacent to the first gate insulator layer and a second charged layer adjacent to the active layer, and the first charged layer includes a semiconductor-like material having a band gap less than 3 eV and the second charged layer includes a dielectric-like material having a band gap greater than 6 eV.

3. The semiconductor structure of claim 1, wherein the at least one charged layer comprises a first charged layer adjacent to the first gate insulator layer and a second charged layer adjacent to the active layer, and the first charged layer includes a dielectric-like material having a band gap greater than 6 eV and the second charged layer includes a semiconductor-like material having a band gap less than 3 eV.

4. The semiconductor structure of claim 1, wherein the oxide material of the at least one charged layer includes zinc oxide, aluminum oxide, indium oxide, hafnium oxide, zirconium oxide, gallium oxide, lanthanum oxide, yttrium oxide, tantalum oxide or a combination thereof.

5. The semiconductor structure of claim 1, wherein the at least one charged layer has an oxygen content higher than an oxygen content of the first gate insulator layer, and the first gate insulator layer and the active layer, respectively physically contact the opposite sides of the at least one charged layer.

6. The semiconductor structure of claim 1, wherein the pair of contact structures is located on the at least one charged layer and at opposite sides of the first gate layer and the first gate insulator layer.

7. The semiconductor structure of claim 6, further comprising an interlayer dielectric layer surrounding the first gate layer, the first gate insulator layer, and the pair of contact structures.

8. The semiconductor structure of claim 1, wherein the pair of contact structures is located above the at least one charged layer, the first gate insulator layer, and the first gate layer.

9. The semiconductor structure of claim 8, further comprising an interlayer dielectric layer surrounding the active layer, the at least one charged layer, the first gate insulator layer, the first gate layer, and the pair of contact structures.

10. The semiconductor structure of claim 1, further comprising:

a second gate insulator layer disposed over the active layer and between the pair of the contact structures; and a second gate layer disposed on the second gate insulator layer.

11. The semiconductor structure of claim 10, wherein lateral dimensions of the second gate insulator layer and the second gate layer are smaller than lateral dimensions of the first gate insulator layer and the first gate layer.

12. A semiconductor structure, comprising:

at least one first transistor structure; and a second transistor structure disposed over the at least one first transistor structure and electrically connected to the at least one first transistor structure through an interconnect structure, comprising:

a semiconductor channel layer;

a multi-layer stack disposed over the semiconductor channel layer, the multi-layer stack comprises a first gate layer, a first gate dielectric layer, a first threshold voltage tuning layer, and a second threshold voltage tuning layer, wherein the first threshold voltage tuning layer is in contact with a surface of the semiconductor channel layer; and source and drain structures disposed over the semiconductor channel layer.

13. The semiconductor structure of claim 12, wherein the first threshold voltage tuning layer includes a first material and the second threshold voltage tuning layer includes a second material, and a band gap of the first material is larger than a band gap of the second material.

14. The semiconductor structure of claim 12, wherein the first threshold voltage tuning layer includes a first material and the second threshold voltage tuning layer includes a second material, and a band gap of the first material is smaller than a band gap of the second material.

15. The semiconductor structure of claim 12, wherein a thickness of the first threshold voltage tuning layer is substantially the same as a thickness of the second threshold voltage tuning layer.

16. The semiconductor structure of claim 12, further comprising a second gate dielectric layer over the multi-layer stack and a second gate layer over the second gate dielectric layer, wherein the second gate dielectric layer and the second gate layer are disposed between the source and drain structures.

17. A method for forming a semiconductor structure, comprising:

forming an active layer over a semiconductor base;

forming a first gate dielectric layer over the active layer;

forming a first gate layer over the first gate dielectric layer;

forming an interfacial layer between the first gate dielectric layer and the active layer, wherein the first gate dielectric layer and the active layer are disposed at opposite sides of the interfacial layer, and the interfacial layer includes an oxide material;

forming an interlayer dielectric layer over the semiconductor base structure that covers the first gate layer, the first gate dielectric layer, the interfacial layer, and the active layer; and forming a pair of contact structures extending through the interlayer dielectric layer and in contact with the active layer.

18. The method of claim 17, wherein forming the interfacial layer between the first gate dielectric layer and the active layer comprises depositing a first oxide material layer and a second oxide material layer having an oxide material different from that of the first oxide material layer.

19. The method of claim 17, wherein forming the interfacial layer between the first gate dielectric layer and the active layer comprises performing a surface treatment process to the first gate dielectric layer.

20. The method of claim 17, further comprising forming a second gate dielectric layer on the active layer and a second gate layer on the second gate dielectric layer, and the second gate dielectric layer and the second gate layer are located between the pair of contact structures within the interlayer dielectric layer.

\* \* \* \* \*